United States Patent [19]

Brehmer et al.

[11] Patent Number: 4,829,541
[45] Date of Patent: May 9, 1989

[54] PSEUDO-TERNARY CODE TRANSMITTER

[75] Inventors: Geoffrey E. Brehmer; Joe W. Peterson, both of Austin, Tex.

[73] Assignee: Advanced Micro Devices, Inc., Sunnyvale, Calif.

[21] Appl. No.: 146,988

[22] Filed: Jan. 22, 1988

[51] Int. Cl.⁴ .................... H04L 25/34; A03K 5/00
[52] U.S. Cl. ..................................... 375/17; 307/261
[58] Field of Search ................ 375/17, 37; 307/261; 358/262

[56] References Cited

U.S. PATENT DOCUMENTS

4,195,237 3/1980 Meslener .......................... 307/261
4,507,621 3/1985 Meyer ................................ 375/17

Primary Examiner—Robert L. Griffin
Assistant Examiner—Marianne Huseman
Attorney, Agent, or Firm—Davis Chin

[57] ABSTRACT

A transmitter for converting a binary digital signal into a pseudo-ternary signal. The transmitter has been designed so as to overcome the problem of line clamping during a power-down condition, provides a current limiting function, and reduces the ringing problem associated with driving an inductive load with a high impedance source.

16 Claims, 9 Drawing Sheets

FIG. 1A
CMOS OUTPUT STAGE WITH POWER APPLIED TO THE PART

FIG. 1B
CMOS OUTPUT STAGE WITHOUT POWER APPLIED TO THE PART

FIG. 1C
NMOS OUTPUT STAGE WITHOUT POWER APPLIED TO THE PART

FIG. 7 — Waveforms for 50Ω Load

FIG. 8 — Waveforms for 400Ω Load

FIG.9 — Waveforms for 5.6 ohms load

FIG.10 — Differential output waveform for 50 ohm load at "S" interface

FIG. 11 DIFFERENTIAL OUTPUT WAVEFORM FOR 400 OHM LOAD AT "S" INTERFACE

FIG. 12 DIFFERENTIAL OUTPUT WAVEFORM FOR 5.6 OHM LOAD AT "S" INTERFACE

PSEUDO-TERNARY CODE TRANSMITTER

BACKGROUND OF THE INVENTION

This invention relates generally to telecommunication circuits and more particularly, it relates to a pseudoternary code transmitter for use in a digital subscriber controller device which permits a digital customer to obtain access and to transmit data across the S interface of the Integrated Services Digital Network.

In the field of telecommunications, use of digital signalling techniques in transmitting information over long distances is gaining more and more prominence for a wide range of communications, including voice, computer data and video data. Typically, the S or subscriber lines interface as referred to by the Consultative Committee for International Telegraphy and Telephony (CCITT) is used to interconnect ISDN terminal equipment (TE) such as a telephone or data generating equipment to one or more network terminators (NT) such as Private Automatic Branch Exchanges (PABX). In larger installations, the NT may be a PBX line card with multiple number of TE's connected thereto which is commonly referred to as a passive bus or multi-point configuration. In smaller installations, a single TE may be connected to an NT which is commonly referred to as a point-to-point configuration. A digital subscriber controller (DSC) device is used in the ISDN terminal equipment to communicate over the CCITT recommended "S" interface. Such a digital subscriber controller device is manufactured and sold by AMD, Inc., Sunnyvale, Calif., under their part No. Am79C30. The digital subscriber controller device is an integrated circuit formed of a single-chip package. As a part of the digital subscriber controller integrated circuit, there are provided transmitter circuitry which function to convert a binary digital signal into a pseudo-ternary signal that will conform to CCITT Recommendation I.430 which is described in a specification entitled "ISDN User-Network Interfaces: Layer 1 Recommendations" (Geneva Version-Rec. I.430, Apr. 8, 1986). The Rec. I.430 specification defines the electrical characteristics for TE's trasmitter circuitry relative to output impedance for both making and spacing conditions when power is applied and during power-down, output response for loading conditions of 50 ohm and 400 ohm templates, and current limiting for a load condition of a 5.6 ohm template.

Figure 1A:
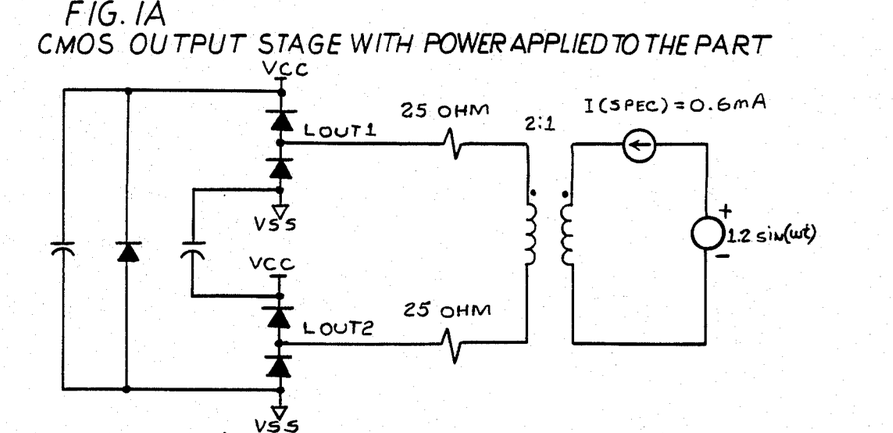
FIG. 1(a) is a schematic representation of the diode devices in a CMOS output structure with power applied.
Figure 1B:
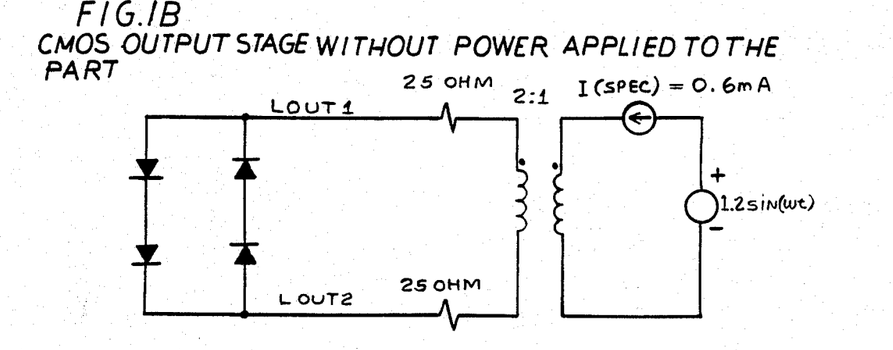
FIG. 1(b) is a schematic representation of the diode devices in a CMOS output structure in the power-down condition when $V_{CC}$ and $V_{SS}$ are held at the same potential (i.e., OV)

In attempting to design a transmitter for meeting the electrical characteristics defined by the Recommendation I.430 specification, there was encountered initially the problem of line clamping during a power-down condition. This problem is inherent within any CMOS output structure due to the back-to-back p-n and n-p diode devices appearing at the outputs. There is illustrated schematically in FIG. 1(a) how these diode devices in the CMOS output stage interface with the twisted pair of transmission lines at the S interface when power is applied. FIG. 1(b) is an equivalent circuit for the CMOS output stage for a power-down condition, illustrating how the transmission line is shorted by the series diodes when $V_{CC} = V_{SS} = 0V$.

Another problem encountered was to design a transmitter which included an accurate voltage source amplifier circuit for driving nominal loads of 50 to 400 ohms, but yet also provide a maximum current drive capability when low resistive loads (i.e., 5.6 ohms) appeared at the outputs. Finally, there was experienced the problem of designing a transmitter that would eliminate ringing on the transmission line caused by driving an inductive load with a high impedance source.

The transmitter circuitry of the present invention is provided as a part of the digital subscriber controller integrated circuit for performing such requirements relative to output impedance, output response and current limiting so as to overcome the problems associated with transmitter designs. This is achieved in the present invention by a pseudo-ternary code transmitter which includes a current source amplifier, a first voltage source amplifier, and a second voltage source amplifier. The current source amplifier serves to supply sufficient drive current to the voltage source amplfiers in order to maintain the proper differential voltage during the 50 and 400 ohm load conditions but yet supply a limited amount of current during the 5.6 ohm loading condition. Each of the voltage source amplifiers includes an output stage formed of a sourcing transistor and a sinking transistor. Linear I.C. charging circuits are provided to slowly turn off and on the sourcing and sinking transistors during mark-to-space and mark-to-mark transitions so as to reduce ringing on the transmission line. Further, the output stage is designed so as to provide a single n-p diode structure at an output node, thereby allowing the transmitter to be powered down without loading the transmission line when other terminal equipment is transmitting.

SUMMARY OF THE INVENTION

In the preferred embodiment of the present invention the digital subscriber controller device, which permits a digital customer to obtain access and to transmit data across an S interface of an ISCN terminal equipment, includes transmitter circuitry for converting a binary digital signal into a pseudo-ternary signal at first and second output nodes to form differential output voltages. The transmitter circuitry includes a current source amplifier circuit responsive to a reference current for generating a first drive current and a second drive current, a first voltage source amplifier circuit, and a second voltage source amplifier circuit. The first voltage source amplifier circuit is responsive to a reference voltage, a first digital control signal, a second digital control signal, and the first drive current for driving the first output node to the reference voltage when the second digital control signal is at a high logic level and for driving the first output node to a ground potential when the first digital control signal is at a high logic level. The second voltage source amplifier circuit is responsive to the reference voltage, the first digital control signal, the second digital control signal and the second drive current for driving the second output node to the reference voltage when the first digital control signal is at a high logic level and for driving the second output node to the ground potential when the second digital control signal is at a high logic level.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
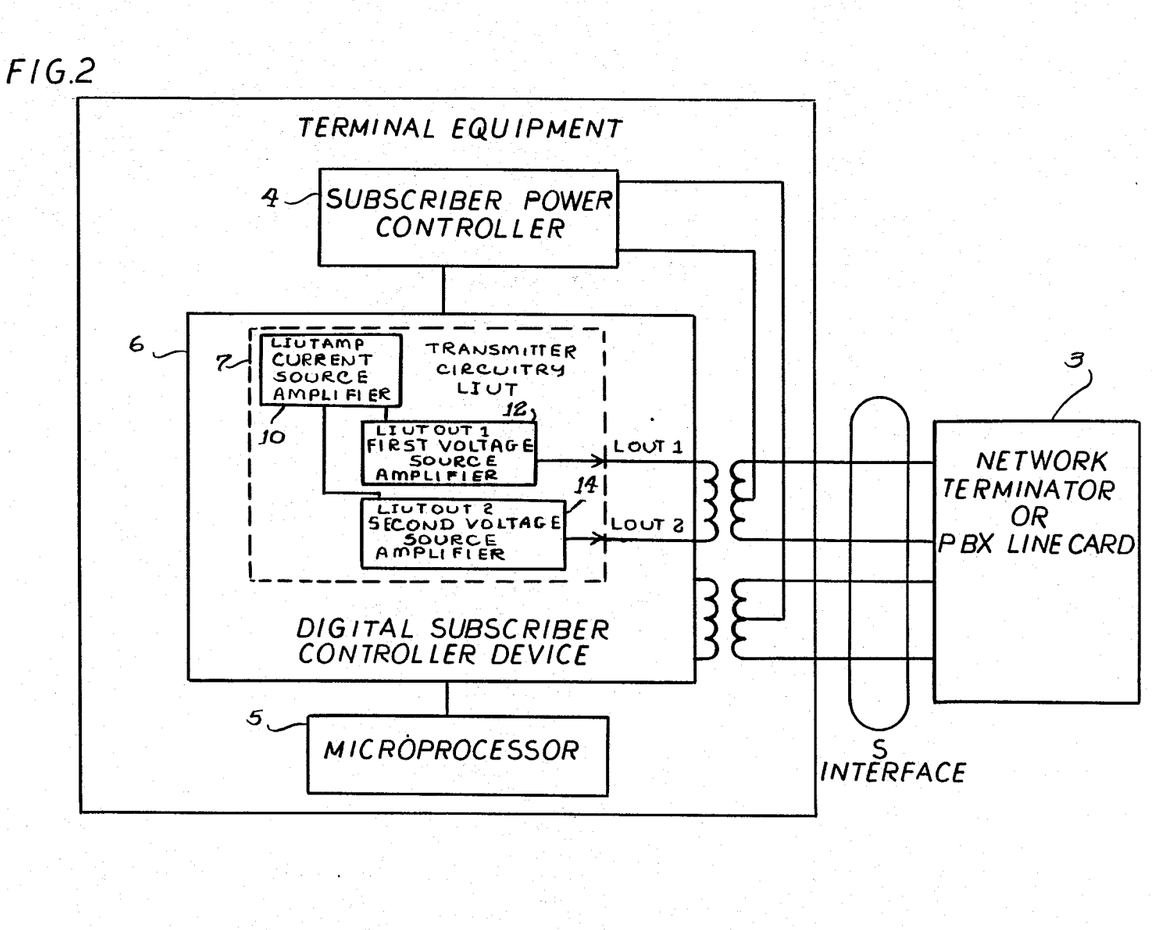
FIG. 2 is an overall block diagram of an integrated services digital network (ISDN) for communication across the S or subscriber interface, according to the present invention.

Referring now in detail to the drawings, there is shown in FIG. 2 an overall block diagram of an integrated services digital network (ISDN) for communication across the S or subscriber lines interface which connects terminal equipment (TE) 2 to a network terminator (NT) 3 such as a central office or private branch exchange (PBX) line card. The TE 2 includes a subscriber power controller 4, a microprocessor 5, and a digital subscriber controller (DSC) device 6. As previously explained, the digital subscriber controller device 6 is an integrated circuit which includes transmitter circuitry 7 of the present invention for converting a binary digital signal into a pseudo-ternary signal.

Figure 3:
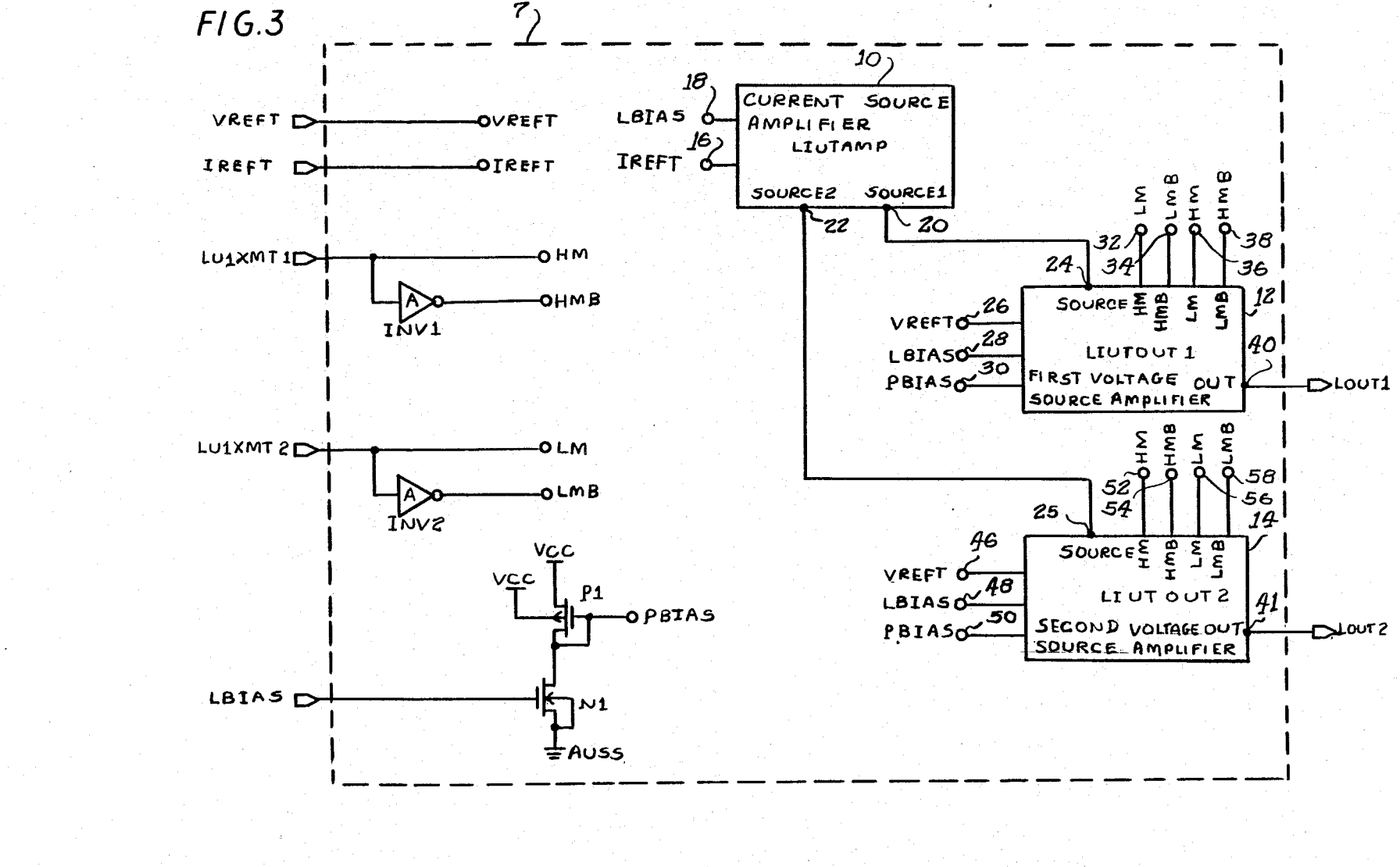
FIG. 3 is a schematic block diagram of the transmitter circuitry of the present invention for use in the digital subscriber controller device of FIG. 2.

As can be seen from FIG. 3, there is illustrated a schematic block diagram of the transmitter circuitry 7 of the present invention which is provided as a part of the same I.C. or chip. The transmitter circuitry 7 is a fully differential voltage source amplifier for converting the binary digital signal into the pseudo-ternary (tri-level) code at external output pins LOUT1 and LOUT2 which are coupled to twisted pair transmission lines at the S interface. The transmitter circuitry 7 receives internally generated input signals consisting of a reference voltage VREFT, a reference current IREFT, a first digital control signal LU1XMT1, a second digital control signal LU1XMT2, and a bias signal LBIAS from other parts of the digital subscriber controller device 6.

The transmitter circuitry 7 (LIUT) consists of a current source amplifier 10 (LIUTAMP), a first voltage source amplifier 12 (LIUTOUT1), a second voltage source amplifier 14 (LIUTOUT2) and associated digital control circuitry. The current source amplifier 10 functions to establish the maximum drive current allowed within the respective voltage source amplifiers 12 and 14. The voltage source amplifiers 12 and 14 function to control the amount of current which is necessary to drive the external output pins LOUT1 and LOUT2 to the reference voltage VREFT.

As defined herein, a high or positive mark condition is referred to when the external pin LOUT2 is at the reference voltage VREFT and the external pin LOUT1 is at a ground potential. A low or negative mark condition is referred to when the external pin LOUT1 is at the reference voltage VREFT and the external pin LOUT2 is at the ground potential. A space condition is referred to when both of the external pins LOUT1 and LOUT2 are at a high impedance resulting in zero differential voltage therebetween due to the presence of a line termination resistance on the S-interface.

The reference voltage VREFT is a fixed voltage source supplied from an internal bandgap generator circuit, and the reference current IREFT is a constant current source generated from a current mirror arrangement located within the bandgap generator circuit. The first digital control signal LU1XMT1 provides a high mark signal HM. The signal LU1XMT1 is also inverted via an inverter INV1 to provide an inverted or complement high mark signal HMB. Similarly, the second digital control signal LU1XMT2 provides a low mark signal LM. The signal LU1XMT2 is also inverted by the inverter INV2 to provide an inverted or complement low mark signal LMB.

The bias signal LBIAS is connected to the gate of an N-channel bias transistor N1. The bias signal LBIAS is a current mirroring signal which is used to bias all of the N-channel transistors within the transmitter circuitry 7. The transistor N1 has its drain connected to the drain of a P-channel bias transistor P1 and its source connected to a ground potential VSS. The transistor P1 has its source connected to a supply potential VCC and its gate and drain connected together. The common gate and drain electrodes of the transistor P1 provide a P-bias signal PBIAS which is used to bias all of the P-channel transistors within the transmitter circuitry 7. In a common implementation, the bulk of the transistor P1 is connected to the supply potential VCC, and the source of the transistor N1 is connected to its substrate. For convenience, the N-channel transistors will be identified by the letter N followed by a particular reference numeral and the P-channel transistors will be identified by the letter P followed by a particular reference numeral.

The current source amplifier 10 receives the reference current IREFT on input node 16 and the bias signal LBIAS on input node 18. The current source amplifier 10 supplies a first drive current SOURCE1 on output node 20 to the output stage within the first voltage source amplifier 12. The current souce amplifier 10 further supplies a second drive current SOURCE2 on output node 22 to the output stage within the second voltage source amplifier 14. The first voltage source amplifier 12 receives the first drive current SOURCE1 on input node 24, the voltage reference VREFT on input node 26, the bias signal LBIAS on input node 28, and the P-bias signal PBIAS on input node 30. The first voltage source amplifier 12 further receives the low mark signal LM on input node 32, the complement low mark signal LMB on input node 34, the high mark signal HM on input node 36, and the complement high mark signal HMB on input node 38. The amplifier 12 generates an output voltage level signal on output node 40 and the external pin LOUT1.

Similarly, the second voltage source amplifier 14 receives the second drive current SOURCE2 on input node 25, the voltage reference VREFT on input node 46, the bias signal LBIAS on input node 48, and the P-bias signal PBIAS on input node 50. The second voltage source amplifier 14 further receives the high mark signal HMB on input node 52, the complement high mark signal HMB on input node 54, the low mark signal LM on input node 56, and the complement low mark signal LMB on input nodes 58. It should be noted that the digital control signals HM, HMB, LM, and LMB are reversed within the two amplifiers 12 and 14. This is because the external pins LOUT1 and LOUT2 must be driven in opposite directions so as to provide the differential output voltages. The amplifier 14 generates an output voltage level signal on output node 41 and the external pin LOUT2.

Figure 4:
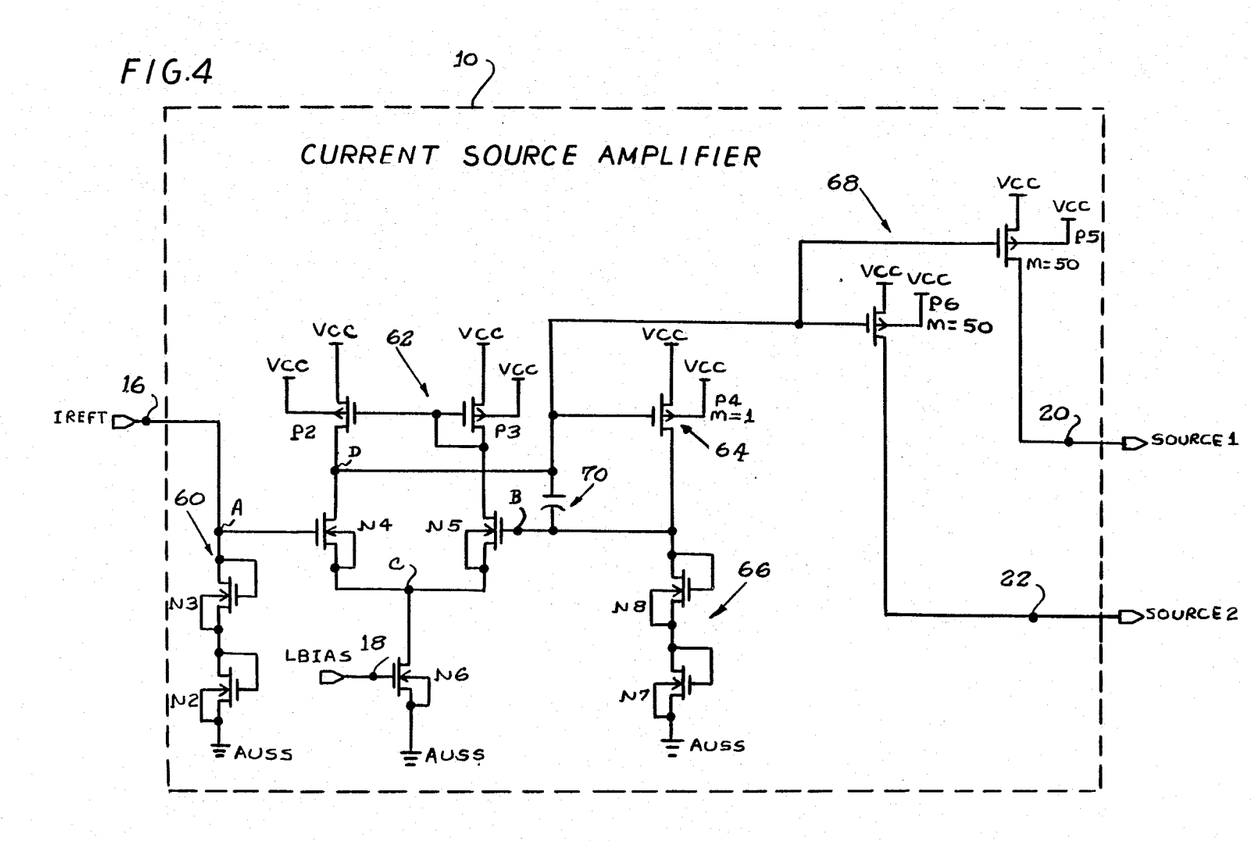
FIG. 4 is a schematic circuit diagram of the current source amplifier of the transmitter circuitry of FIG. 3.

A detailed schematic circuit diagram of the current source amplifier 10 is illustrated in FIG. 4. The current source amplifier 10 includes a bias circuit 60, a differential amplifier 62, a second gain stage transistor 64, a load circuit 66, and an output circuit 68. The bias circuit 60 is formed of two series gm-connected transistors N2 and N3. The transistor N2 has its gate and drain electrodes connected together and to the source of the transistor N3. The transistor N2 has its source connected to its substrate and to the ground potential VSS. The transistor N3 also has its gate and drain electrodes connected together and to the input node 16 for receiving the reference current IREFT so as to generate an internal reference voltage on node A for the differential amplifier 62. The differential amplifier 62 is comprised of a pair of N-channel input transistors N4 and N5 whose gates are connected to respective nodes A and B, a pair of P-channel transistors P2 and P3 which constitute a current mirror circuit and serve as a load for the input transistors N2 and N3, and an N-channel current source transistor N6 which produces a constant current at node C.

The output of the differential amplifier at node D is applied to the gate of the second gain stage transistor 64 (P4). The load circuit 66 is formed of two series-connected transistors N7 and N8 which are matched geometrically to the transistors N2 and N3. The transistor N7 has its gate and drain electrodes connected together and to the source of the transistor N8. The transistor N7 has its source connected to its substrate and to the ground potential VSS. The transistor N8 also has its gate and drain electrodes connected together and to the drain of the transistor P4. The differential amplifier 62 amplifies the difference between the voltages applied to the respective nodes A and B and produces a differentially amplified signal at the node D for driving the gate of transistor P4 until the voltage at the node B is equal to the voltage at the node A. Thus, the current through transistor P4 will be equal to the reference current IREFT. The first and second drive currents SOURCE1 and SOURCE2 are generated by mirroring the current flowing in the transistor P4 to respective sourcing transistors P5 and P6 of the output circuit 68. The maximum currents supplied to the respective voltage source amplifiers 12 and 14 are determined by the ratio of the transistor sizes between the respective sourcing transistors P5, P6 to transistor P4 times the reference current IREFT. A frequency compensation capacitor 70 has a first electrode connected to the node B and a second electrode connected to the node D.

Figure 5:
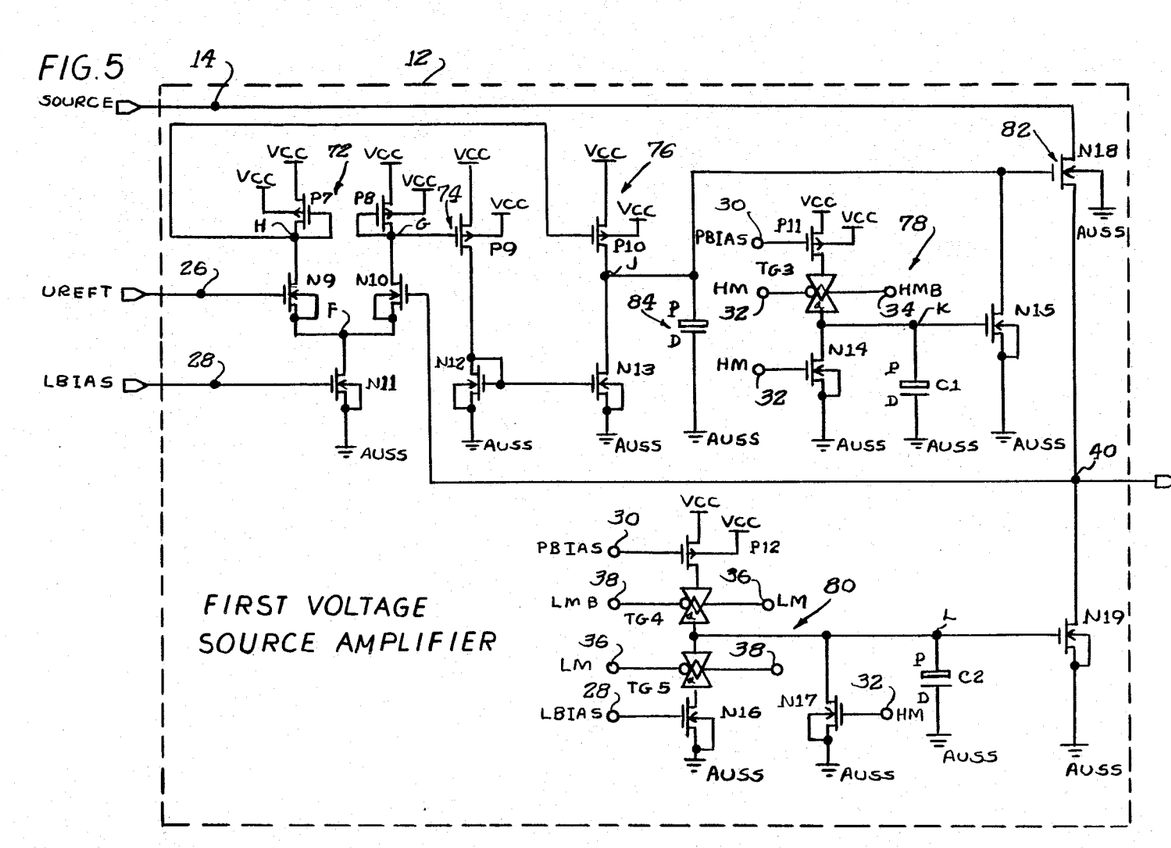
FIG. 5 is a schematic circuit diagram of the voltage source amplifier 12 or 14 of the transmitter circuitry of FIG. 3.

A detailed circuit diagram of the first voltage source amplifier 12 is illustrated in FIG. 5. Since the second voltage source amplifier 14 is identical in construction to the first voltage source amplifier 12, it will be sufficient to describe only the components and their interconnection of the amplifier 12. The voltage source amplifier 12 includes a differential amplifier 72, a first gain circuit 74, a second gain circuit 76, a first linear charging circuit 78, a second linear charging circuit 80, and a push-pull output stage 82. The differential amplifier 72 is comprised of a pair of N-channel input transistors N9 and N10 whose gates are connected to respective voltage VREFT and the output voltage level signal from the output node 40, a pair of P-channel transistors P7 and P8 which constitute a current mirror circuit and serve as a load for the input transistors N9 and N10, and an N-channel current source transistor N11 which produces a constant current at node F.

The first gain circuit 74 is formed of a P-channel drive transistor P0 and an N-channel load transistor N12. The second gain circuit 76 is formed of a P-channel drive transistor P10 and an N-channel load transistor N13. A first amplified output signal from the differential amplifier 72 at node G is connected to the gate of the transistor P9, and a second amplified output signal from the differential amplifier at node H is connected to the gate of the transistor P10. The differential amplifier 72 compares the output voltage level signal at the output node 40 with the reference voltage VREFT and drives a node J until the output voltage and the reference voltage are equal. A frequency compensation capacitor 84 has a first electrode connected to the node J and a second electrode connected to the ground potential VSS.

The first linear charging circuit 78 includes a P-channel charging transistor P11, a transmission gate TG3, a pull-down transistor N14, a capacitor C1, and a switching transistor N15. The charging transistor P11 is used to provide a bias current for charging the capacitor C1 when the transmission gate TG3 is turned on or closed.

The second linear charging circuit 80 includes a P-channel charging transistors P12, a transmission gate TG4, a transmission gate TG5, an N-channel charging transistor N16, a pull-down transistor N17, and a capacitor C2. The P-channel charging transistor P12 is used to provide a similar bias current to transistor P11 for charging the capacitor C2 when the transmission gate TG4 is turned on or closed. The N-channel charging transistor N16 and the transmission gate TG5 function to discharge the capacitor C2 when the transmission gate TG5 is turned on or closed.

Figure 1C:
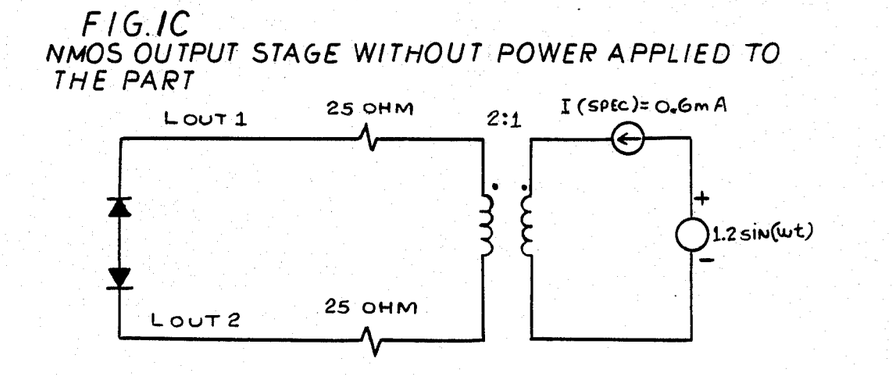
FIG. 1(c) is a schematic representation of the diode device in the NMOS output stage of the present invention during a power-down condition when $V_{CC}$ and $V_{SS}$ are held at the same potential (i.e., OV)

The push-pull output stage 82 includes an N-channel output sourcing transistor N18 and an N-channel output sinking transistor N19. The output sourcing transistor N18 has its drain connected to the input node 24 for receiving the first drive current SOURCE1 and its source connected to the output node 40. The gate of the transistor N18 is connected to the node J and to the drain of the switching transistor N15. The bulk of the transistor N18 is connected to the ground potential which serves to eliminate the p-n diode associated with the p-well to n-substrate encountered in the typical CMOS output stage during the power-down condition as is shown in FIG. 1(b). The output sinking transistor N19 has its drain connected to the source of the output transistor N18 and to the output node 40. Further, the output node 40 is connected to the gate of the input transistor N10. The gate of the transistor N19 is connected to a node L and to the drain of the pull-down transistor N17. The bulk of the output transistor N19 is connected to its source which is tied to the ground potential VSS. As a result, there is only a single n-p diode structure connected to each of the external pins LOUT1 and LOUT2. An equivalent circuit of the NMOS output stage during a power-down condition of the present invention is illustrated in FIG. 1(c). As can be seen, the diode structure of FIG. 1(c) cannot be forward biased so as to cause loading of the transmission line when signals are present at the external pins LOUT1 and LOUT2 (i.e., transmitters in other TE's are transmitting) and when the transmitter circuitry 7 (LIUT) is powered down.

Referring now to FIGS. 3 and 5, the operation of the voltage source amplifiers 12 and 14 will now be described. In order to generate the high mark condition, the first digital control signal LU1XMT1 will be at a high or "1" logic level so as to cause the corresponding signals HM=1 and HMB=0 to be applied to the voltage source amplifiers 12 and 14. This will, in turn, cause the output node 41 of the amplifier 14 to be driven to the reference voltage VREFT and the output node 40 of the amplifier 12 to be driven to the ground potential. During the high mark condition, the sinking transistor N19' (the symbol "'" will be affixed to reference designation for the components in the amplifier 14) of the amplifier 14 is turned off via the pull-down transistor N17' and the output sourcing transistor N18' is used to supply drive current to the output node 41. Further, the pull-down transistor N14' of the amplifier 14 is also turned on which causes the switching transistor N15' to be turned off. This allows the voltage at the node 72'. The differential amplifier compares the output voltage at the node 41 with the reference voltage VREFT and drives the node J until there is an equality. The current source amplifier 10 supplies the drive current from its output node 22 to the output sourcing transistor N18' via the input node 25.

Further, the pull-down transistor N14 of the amplifier 12 is turned off and the transmission gate TG3 is turned on so as to allow the bias current from the charging transistor P11 to charge up the capacitor C1 at node K, thereby slowly turning on the switching transistor N15 As a consequence, the sourcing transistor N18 of the amplifier 12 will become turned off. The output sinking transistor N19 of the amplifier 12 is slowly turned on by the bias current from the charging transistor P12 charging up the capacitor C2 at the node L via the transmission gate TG4. Therefore, the output node 40 will be pulled to the ground potential VSS.

For normal loading conditions, the drive current SOURCE2 will exceed the current necessary to drive the external pin LOUT2 to the reference voltage VREFT. Thus, the differential amplifier 72' will pinch off the output current through the output sourcing transistor N18' in order to control the voltage at the output node 41. However, when an abnormal load condition is applied such as a short circuit, the differential amplifier 72' will saturate because the output voltage level at the node 41 will never reach the reference voltage VREFT. AT this time, the differential amplifier will drive the node J as high as possible and force the sourcing transistor N18' to drive the load with all of the source current supplied from the current source amplifier 10. The voltage source amplifier 14 will no longer act as a voltage source, but rather it will function as a limited current source.

In order to generate the low mark condition, the second digital control signal LU1XMT2 will be at a high or "1" logic level so as to cause the corresponding signals LM=1 and LMB=0 to be applied to the voltage source amplifiers 12 and 14, respectively. (It should be noted that the control signals LU1XMT1 and LU1XMT2 can never be at the high logic level simultaneously.) This will render the output node 40 of the amplifier 12 to be driven to the reference voltage VREFT and the output node 41 of the amplifier 14 to be driven to the ground potential. During the low mark condition, the operation of the amplifiers 12 and 14 are reversed as explained above with respect to the high mark condition. A spacing condition is derived when both the control signals LU1XMT1 and LU1XMT2 are at the low or "0" logic level.

As will be recalled, ringing or oscillations will be generally experienced when driving a high impedance into an inductive load. The current within an inductive load cannot be quickly dissipated when the source is at a high impedance, thereby causing the ringing to appear on the transmission line. In other words, the energy stored within associated leakage inductors for the transformers used to connect the transmitter circuitry 7 to the external line during a high or low mark condition will cause ringing on the transmission line when a mark-to-space transition occurs. This is because the external pins LOUT1 and LOUT2 are forced to a high impedance during the spacing condition and the energy stored in the leakage inductors has no place to be dissipated. Thus, the energy will bounce back and forth between the parasitic capacitance at the external pins and the inductors until dissipated slowly through externally connected resistors. A similar ringing problem is encountered during a mark-to-mark transition since the output impedance will go momentarily to the high impedance state during such transition.

In FIGS. 6(a)–6(f) there are illustrated simplified circuit diagrams of the transmitter circuitry showing the respective output sourcing and sinking transistors (N18, N19, N18', N19') in each of the voltage source amplifiers 12 and 14 connected via external series resistors (R1 and R2), leakage inductors (LEAK1 and LEAK2), transformer XFMR, and load resistor $R_L$ to the S interface. Further, there is described in FIGS. 6(a)–6(f) the initial states and subsequent states of each of the output sourcing and sinking transistors of each voltage source amplifier to effect a particular transition at the external pins LOUT2 and LOUT1.

Figure 6A:
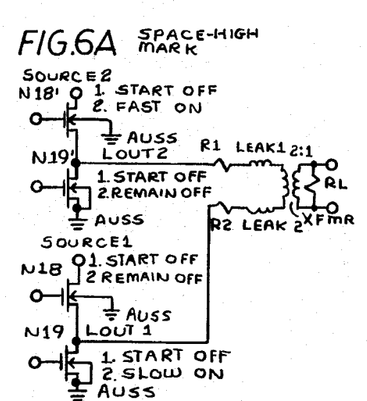
FIG. 6(a)–6(f) are simplified schematic diagrams of the transmitter, showing the output transistors and their operational state in each of the voltage source amplifiers.
Figure 6B:
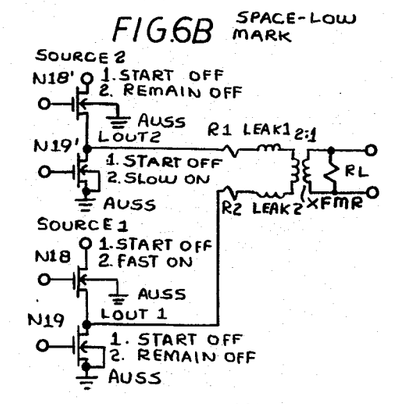
Figure 6C:
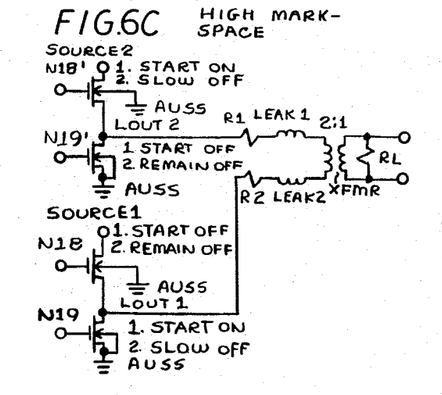
Figure 6D:
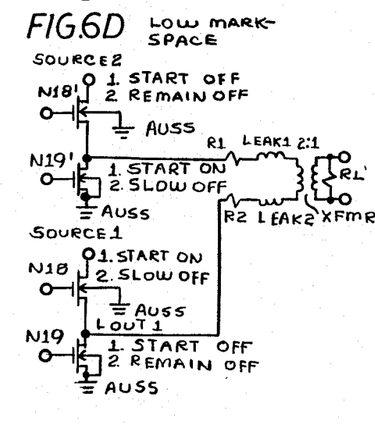
Figure 6E:
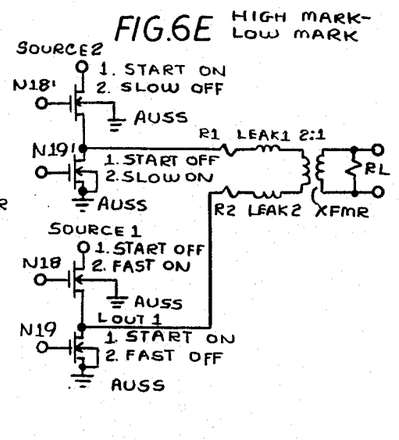
Figure 6F:
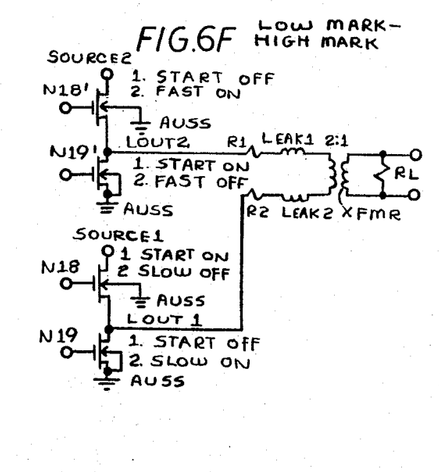

FIG. 6(a) shows the initial and subsequent states of the output transistors (N18', N19', N18, N19) when a space-to-mark transition takes place. As can be seen, all of the transistors N18', N19', N18, N19 are initially turned off. The transistor N18' is then quickly turned on so as to drive quickly the output node 41 to the high mark, and the transistor N19 is turned slowly on so as to not load the output node 40. FIG. 6(b) shows the initial and subsequent states of the output transistors when a space-to-low mark transition takes place. Again, all of the output transistors are initially turned off. The transistor N18 is then quickly turned on so as to drive quickly the node 40 to the low mark, and the transistor N19' is turned on slowly so as to not load the output node 41. In FIGS. 6(c) and 6(d), there are illustrated the initial and subsequent states of the output transistors when a high mark-to-space transition and a low markto-space transition takes place, respectively. In FIGS. 6(e) and 6(f), there are illustrated the initial and subsequent states of the output transistors when high mark-to-low mark transition and low mark-to-high mark transition takes place, respectively. The "turn on" and "turn off" operation of the output transistors in FIGS. 6(c)–6(f) serve to eliminate the ringing problem associated during the mark-to-space and mark-to-mark transitions as discussed above.

Figure 7:
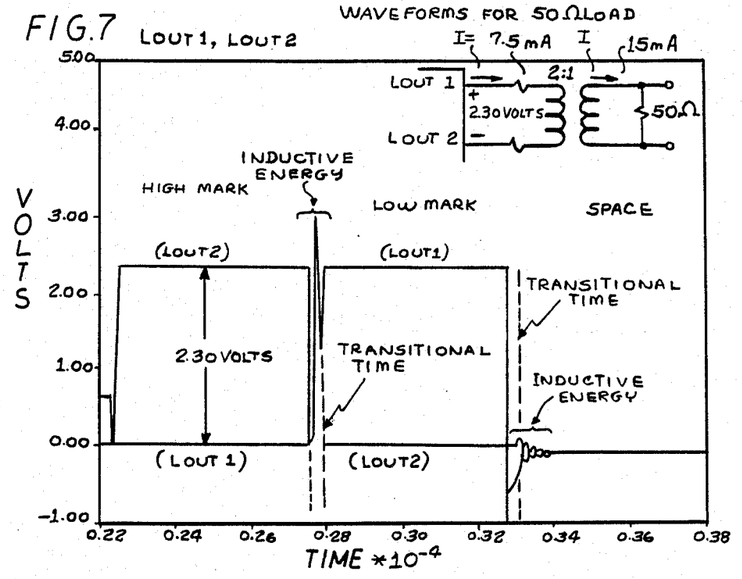
FIGS. 7–9 are waveforms illustrating the voltage at the output nodes during the various loading conditions.
Figure 8:
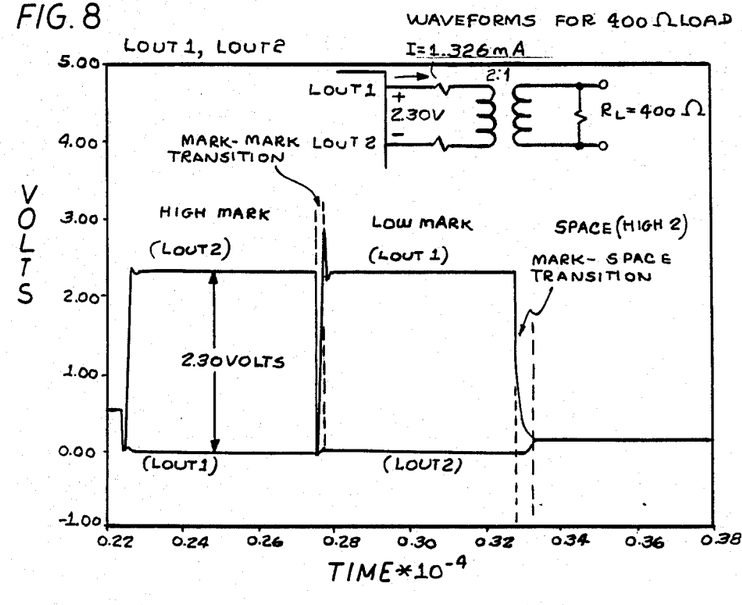
Figure 9:
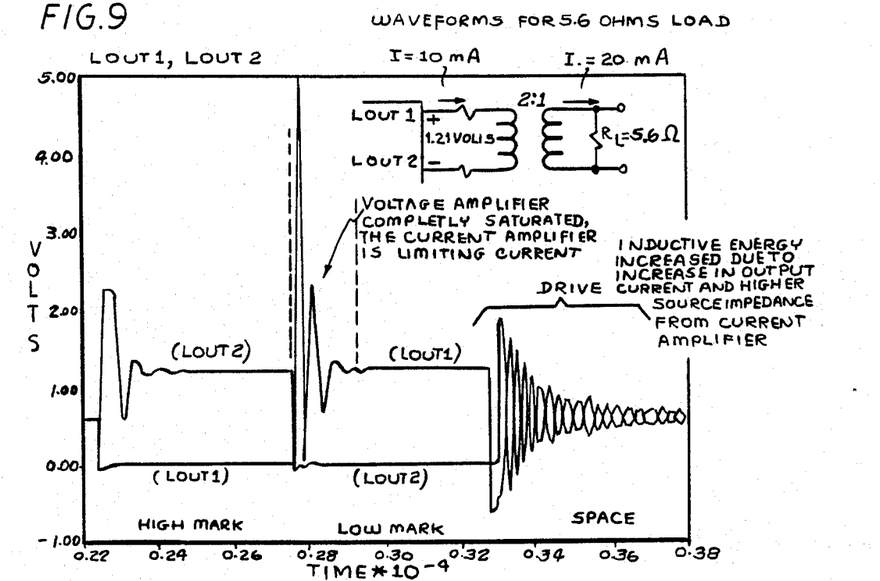

In FIGS. 7–9 there are depicted waveforms illustrating the response at the external pins LOUT1 and LOUT2 for 50, 400 and 5.6 ohm loading conditions. FIG. 7 shows how the inductive energy creates ringing at the external pins when the load $R_L$ is made equal to 50 ohms. The areas labeled "transitional time" are the times in which the output transistors are being turned on and off slowly. FIG. 8 illustrates how the ringing at the external pins decreases when the load $R_L$ is increased to 400 ohms. This is due to the fact that the amount of energy stored in the leakage inductors is reduced since the output current is lower with a 400 ohm load than with a 50 ohm load. FIG. 9 shows how the ringing at the external pins increases when the load $R_L$ is decreased to 5.6 ohms. This increased ringing is caused by the increased output drive current supplied to the load and the high source impedance of the transmitter circuitry. However, it can be seen that the differential output voltage across the external pins is decreased. This is because of the current limiting function of the transmitter, as previously described.

Figure 10:
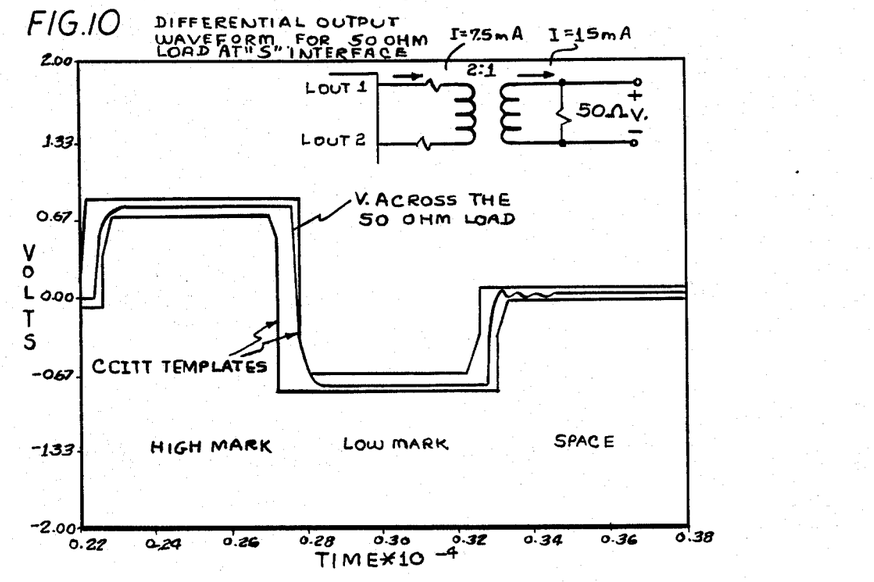
FIGS. 10–12 are output voltages across the various loads at the "S" interface for the respective transitions in FIGS. 7–9.
Figure 11:
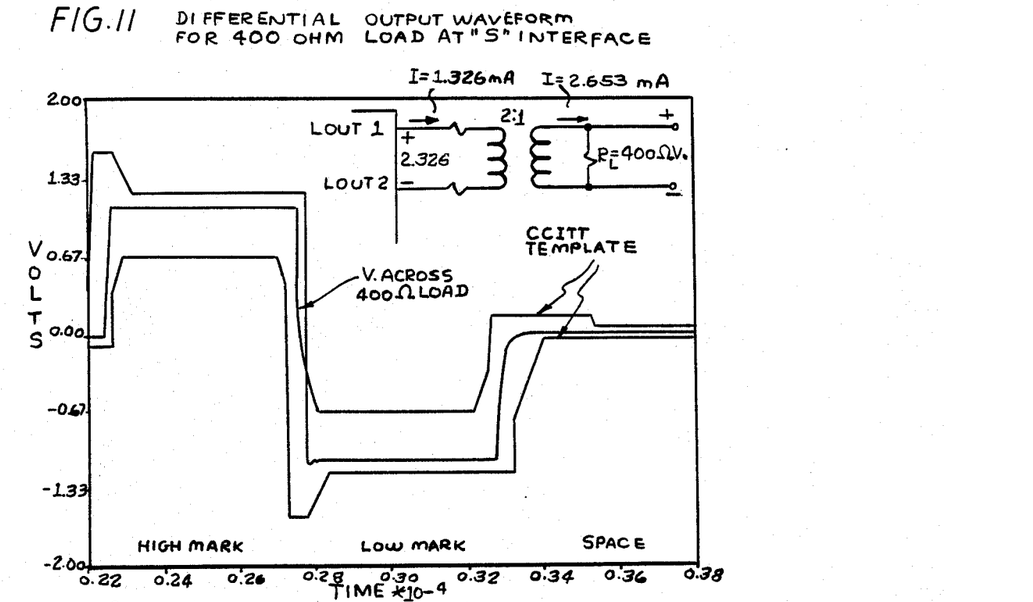
Figure 12:
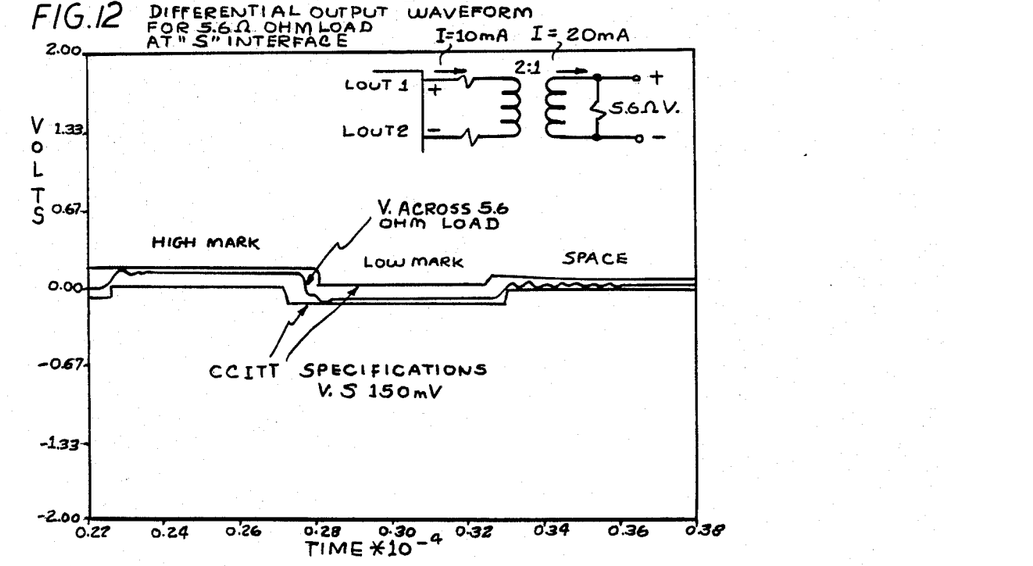

In FIGS. 10–11, there are depicted waveforms at the "S" interface of the output voltage across the various loading conditions of FIGS. 7–9, respectively. FIG. 10 shows the output voltage across the 50 ohm load and how it meets the drive capability for the pulse template specified by the CCITT Recommendation I.430. FIG. 11 shows similarly the output voltage across the 400 ohm load and how it meets the drive capability for the pulse templates. FIG. 12 shows similarly the output voltage across the 5.6 ohm load and how it meets the current limiting function for the pulse templates, as specified.

From the foregoing detailed description, it can thus be seen that the present invention provides an improved transmitter which functions to convert a binary digital signal into a pseudo-ternary signal. The transmitter circuitry of the present invention is formed of a current source amplifier circuit, a first voltage source amplifier circuit, and a second voltage source amplifier circuit. The transmitter of the present invention has been designed so as to avoid the line clamping problem encountered during a power-down condition, provide a current limiting function for the voltage source amplifier, and eliminates the ringing problem encountered when driving an inductive load with a high impedance source.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a digital subscriber controller device which permits a digital customer to obtain access and to transmit data across an S interface of an ISDN terminal equipment, said controller device includes transmitter circuit means for converting a binary digital signal into a pseudo-ternary signal at first and second output nodes to form differential output voltages, the improvement comprising:

current source amplifying means (10) responsive to a reference current for generating a first drive current (SOURCE1) and a second drive current (SOURCE2);

first voltage source amplifying means (12) responsive to a reference voltage, a first digital control signal, a second digital control signal and said first drive current for driving said first output node (40) to the reference voltage when said second digital control signal is at a high logic level and for driving said first output node (40) to a ground potential when said first digital control signal is at a high logic level; and second voltage source amplifying means (14) responsive to said reference voltage, first digital control signal, second digital control signal, and second drive current for driving said second node (41) to the reference voltage when said first digital control signal is at a high logic level and for driving said second output node (41) to the ground potential when said second digital control signal is at a high logic level; and said first and second voltage source amplifying means (12, 14) maintaining said respective first and second output nodes (40, 41) at a high impedance level when both said first and second digital control signals are at a low logic level.

2. In a controller device as claimed in claim 1, wherein a high mark condition is established when said second node (41) is driven to the reference voltage and said first output node (40) is driven to the ground potential, a low mark condition is established when said first output node (40) is driven to the reference voltage and said second output node (41) is driven to the ground potential, and a space condition is established when both said first and second control signals are at a low logic level so that no differential output voltage exists across said first and second output nodes (40, 41).

3. In a controller device as claimed in claim 2, wherein said first voltage source amplifying means (12) includes differential amplifying means (72) for comparing the voltage at the first node (40) with the reference voltage to generate a differentially amplified signal and an output stage (82) formed on an N-channel sourcing transistor (N18) and an N-channel sinking transistor (N19), said sourcing transistor (N18) having its drain connected to receive said first drive current and having its source connected to the drain of said sinking transistor (N19) and to said first output node (40), and its gate connected to receive said differentially amplified signal and a first charge control current from a first linear charging circuit (78), said sinking transistor (N19) having its drain also connected to said first output node (40) and having its gate connected to receive a second charge control current from a second linear charging circuit (80).

4. In a controller device as claimed in claim 3, wherein said first linear charging circuit (78) includes a P-channel charging transistor (P11), a transmission gate (TG3), a pull-down transistor (N14), a capacitor (C1), and a switching transistor (N15).

5. In a controller device as claimed in claim 4, wherein said second charging circuit (80) includes a P-channel charging transistor (P12), a transmission gate (TG4), a transmission gate (TG5), an N-channel charging transistor (N16), a pull-down transistor (N17), and a capacitor (C2).

6. In a controller device as claimed in claim 3, wherein said second voltage source amplifying means (14) includes differential amplifying means (72') for comparing the voltage at the second output node (41) with the reference voltage to generate a differentially amplified signal and an output stage (82') formed of an N-channel sourcing transistor (N18') and an N-channel sinking transistor (N19'), said sourcing transistor (N18') having its drain connected to receive said second drive current, its source connected to the drain of said sinking transistor (N19') and to said second output node (41), and its gate connected to receive said differentially amplified signal and a third charge control current from a third linear charging circuit (78'), said sinking transistor (N19') having its drain also connected to said second output node (41) and having its gate connected to receive a fourth charge control current from a fourth linear charging circuit (80').

7. In a controller device as claimed in claim 6, wherein said third linear charging circuit (78') includes a P-channel charging transistor (P11'), a transmission gate (TG3'), a pull-down transistor (N14'), a capacitor (C1'), and a switching transistor (N15').

8. In a controller device as claimed in claim 7, wherein said fourth charging circuit (80') includes a P-channel charging transistor (P12'), a transmission gate (TG4'), a transmission gate (TG5'), an N-channel charging transistor (N16'), a pull-down transistor (N17'), and a capacitor (C2).

9. In a controller device as claimed in claim 8, wherein said sourcing and sinking transistors (N18, N19, N18', N19') in said first and second voltage source amplifying means (12, 14) are slowly turned off and on by said first through fourth linear charging circuits (78, 80, 78', 80') during mark-to-spacing and mark-to-mark transitions so as to reduce ringing in a transmission line.

10. In a controller device as claimed in claim 6, wherein the bulk of said source transistors (N18, N18') in said first and second voltage source amplifying means (12, 14) is connected to the ground potential and the substrate of said sinking transistors (N19, N19') in said first and second voltage source amplifying means (12, 14) is connected to its respective source and also to the ground potential, thereby providing a single n-p diode structure at the output nodes.

11. In a controller device as claimed in claim 10, wherein said current source amplifying means (10) includes differential amplifying means (62) responsive to the reference current for generating a differentially amplified signal, a second stage transistor (P4) having its gate coupled to the differentially amplified signal, and an output circuit (68).

12. In a controller device as claimed in claim 11, wherein said output circuit (68) includes a first sourcing transistor (P5) and a second sourcing transistor (P6), said first sourcing transistor (P5) having its source connected to a supply potential (VCC), its drain connected to the drain of said N-channel sourcing transistor (N18) of said first voltage source amplifying means (12) to provide the first drive current, and its gate connected to the differentially amplified signal, said second sourcing transistor (P6) having its source connected to the supply potential (VCC), its drain connected to the drain of said N-channel sourcing transistor (N18') of said second voltage source amplifying means (14) to provide the second drive current, and its gate connected to the differentially amplified signal.

13. In a controller device as claimed in claim 1, wherein said first and second output nodes (40, 41) are driven to a known voltage level when coupled to 50 or 400 ohm loading conditions and wherein said first and second output nodes (40, 41) provide a fixed, maximum drive current when connected to a 5.6 ohm loading condition.

14. A transmitter circuit for converting a binary digital signal into a pseudo-ternary signal at first and second output nodes to form differential output voltges, said transmitter circuit comprising:
  current source amplifying means (10) responsive to a reference current for generating a first drive current (SOURCE1) and a second drive current (SOURCE2);
  first voltage source amplifying means (12) responsive to a reference voltage, a first digital control signal, a second digital control signal and said first drive current for driving said first output node (40) to the reference voltage when said second digital control signal is at a high logic level and for driving said first output node (40) to a ground potential when said first digital control signal is at a high logic level;
  second voltage source amplifying means (14) responsive to said reference voltage, first digital control signal, second digital control signal, and second drive current for driving said second node (41) to the reference voltage when said first digital control signal is at a high logic level and for driving said second output node (41) to the ground potential when said second digital control signal is at a high logic level;
  said first and second voltage source amplifying means (12, 14) maintaining said respective first and second output nodes (40, 41) at a high impedance level when both said first and second digital control signals are at a low logic level;
  said first and second output nodes (40, 41) being driven to a known voltage level when coupled to 50 or 400 ohm loading conditions while providing a fixed maximum drive current when said output nodes (40, 41) are coupled to a 5.6 ohm loading condition; and
  linear charging means (78, 80) for slowly turning off and on said first and second voltage source amplifying means (12, 14) during mark-to-space and mark-to-mark transitions so as to reduce ringing in a transmission line.

15. A transmitter circuit as claimed in claim 14 wherein said current source amplifying means (10) includes differential amplifying means (62) responsive to the reference current for generating a differentially amplified signal, a gain transistor (P4) having its gate coupled to the differentially amplified signal, and an output circuit (68).

16. A transmitter circuit as claimed in claim 15, wherein said output circuit (68) includes a first sourcing transistor (P5) and a second sourcing transistor (P6), said first sourcing transistor (P5) having its source connected to a supply potential (VCC), its drain connected to the drain of said N-channel sourcing transistor (N18) of said first voltage source amplifying means (12) to provide the first drive current, and its gate connected to the differentially amplified signal, said second sourcing transistor (P6) having its source connected to the supply potential (VCC), its drain connected to the drain of said N-channel sourcing transistor (N18') of said second voltage source amplifying means (14) to provide the second drive current, and its gate connected to the differentially amplified signal.

* * * * *